United States Patent
Liu et al.

(10) Patent No.: US 8,411,491 B1
(45) Date of Patent: Apr. 2, 2013

(54) MEMORY ARRAY WITH DISTRIBUTED CLEAR TRANSISTORS AND VARIABLE MEMORY ELEMENT POWER SUPPLY

(75) Inventors: Lin-Shih Liu, Fremont, CA (US); Mark T. Chan, San Jose, CA (US)

(73) Assignee: Altera Corporation, San Jose, CA (US)

( * ) Notice: Subject to any disclaimer, the term of this patent is extended or adjusted under 35 U.S.C. 154(b) by 136 days.

(21) Appl. No.: 12/983,816

(22) Filed: Jan. 3, 2011

(51) Int. Cl.
*G11C 11/00* (2006.01)
*G11C 7/00* (2006.01)

(52) U.S. Cl. .................. 365/154; 365/156; 365/189.11

(58) Field of Classification Search ............... 365/154
See application file for complete search history.

(56) References Cited

U.S. PATENT DOCUMENTS

| | | | |
|---|---|---|---|
| 4,879,686 A * | 11/1989 | Suzuki et al. | 365/189.11 |
| 4,958,326 A * | 9/1990 | Sakurai | 365/185.06 |
| 5,325,325 A * | 6/1994 | Azuma | 365/156 |
| 7,200,020 B2 * | 4/2007 | Ramaraju et al. | 365/189.15 |
| 7,277,351 B2 | 10/2007 | Liu et al. | |
| 7,411,853 B2 * | 8/2008 | Liu et al. | 365/226 |
| 7,634,713 B1 | 12/2009 | Ngo | |
| 7,710,765 B2 * | 5/2010 | Hanafi | 365/156 |
| 7,768,818 B1 * | 8/2010 | Chan et al. | 365/154 |
| 7,844,886 B1 | 11/2010 | Ngo | |
| 7,911,826 B1 * | 3/2011 | Liu et al. | 365/154 |
| 7,948,792 B1 * | 5/2011 | Lee et al. | 365/154 |
| 8,208,314 B2 * | 6/2012 | Zimmerman | 365/189.05 |

OTHER PUBLICATIONS

Liu, Lin-Shih., et al. U.S. Appl. No. 12/057,343, filed Mar. 27, 2008.

* cited by examiner

*Primary Examiner* — Son Mai
(74) *Attorney, Agent, or Firm* — Treyz Law Group; G. Victor Treyz; Jason Tsai

(57) ABSTRACT

Memory elements may be provided that include bi-stable data storage elements based on cross-coupled inverters. A pair of address transistors may be used to implement a differential data writing scheme for the memory elements. One of the address transistors may be coupled between a first data line and a first data storage node in each memory element and another of the address transistors may be coupled between a second data line and a second data storage node. A read circuit may be coupled to the second data storage node. Clear transistors may be interspersed through the array. The clear transistors may help pull the data lines to desired voltages during clear operations. An adjustable power supply may supply a weakened power supply voltage to a pull-up clear transistor and to the first and second inverters during clear operations.

24 Claims, 12 Drawing Sheets

MEMORY ARRAY WITH DISTRIBUTED CLEAR TRANSISTORS AND VARIABLE MEMORY ELEMENT POWER SUPPLY

BACKGROUND

This invention relates to volatile memory elements, and more particularly, to circuitry for clearing memory elements.

Integrated circuits often contain volatile memory elements such as static random-access memory (SRAM) elements. Memory elements can be used to temporarily store data during data processing operations. For example, an integrated circuit that contains processing logic may contain an array of SRAM elements for storing data that is used by the processing logic. Memory elements may also be used in memory chips. Circuits such as field-programmable gate arrays and other programmable devices may contain memory elements that store configuration data for configuring programmable logic.

During operation of an integrated circuit with memory elements, data may be written into the memory elements and may be read from the memory elements. In some situations, it is desirable to clear a group of memory elements. For example, it may be desirable to clear a group of memory elements on a field-programmable gate array before configuration data is loaded into the memory elements. The clearing process ensures that the memory elements have a desired state (i.e., each memory element contains a logic zero). Once cleared, the memory elements may be reliably loaded with desired data.

To facilitate clearing operations, some memory element designs include a dedicated clear transistor in each memory element. The clear transistor may be coupled between a data storage node in the memory element and a ground terminal. When it is desired to clear a memory element of this type, a clear control signal can be asserted. The clear control signal turns on the clear transistor and pulls the data storage node to ground, clearing the memory element. Memory elements can be cleared in this way during power-up operations or after an integrated circuit has been powered.

In conventional memory element designs such as these, a significant amount of circuit resources are devoted to supporting clear operations, because each memory element is provided with a dedicated clear transistor.

SUMMARY

Integrated circuits may be provided with memory arrays having enhanced memory element clearing schemes. A memory array may have rows and columns of memory elements. Data lines may be used to supply data to rows of memory elements during data writing operations. A differential writing scheme may be used in which a pair of address transistors is associated with each memory cell. A first of the address transistors in each memory element may be coupled between a first data line and a first data storage node in the memory element and a second of the address transistors in the memory element may be coupled between a second data line and a second data storage node in the memory element. Read circuits may be used to supply data from respective memory elements to corresponding data lines during read operations.

Clear transistors may be sparsely interspersed throughout the array. The clear transistors may help pull the data lines to desired voltages during clear operations. The clear transistors may, for example, be provided in pairs. A first clear transistor in the pair may be a pull-up transistor that pulls up a first of the data lines in a row of memory elements to a positive power supply voltage. A second clear transistor in the pair may be a pull-down transistor that pulls down a second of the data lines in the row to a ground voltage.

The memory elements may have bi-stable data storage elements based on cross-coupled inverters. An adjustable power supply may supply a weakened power supply voltage to the pull-up clear transistors and to the cross-coupled inverters during clear operations.

Further features of the invention, its nature and various advantages will be more apparent from the accompanying drawings and the following detailed description of the preferred embodiments.

DETAILED DESCRIPTION

Figure 1:
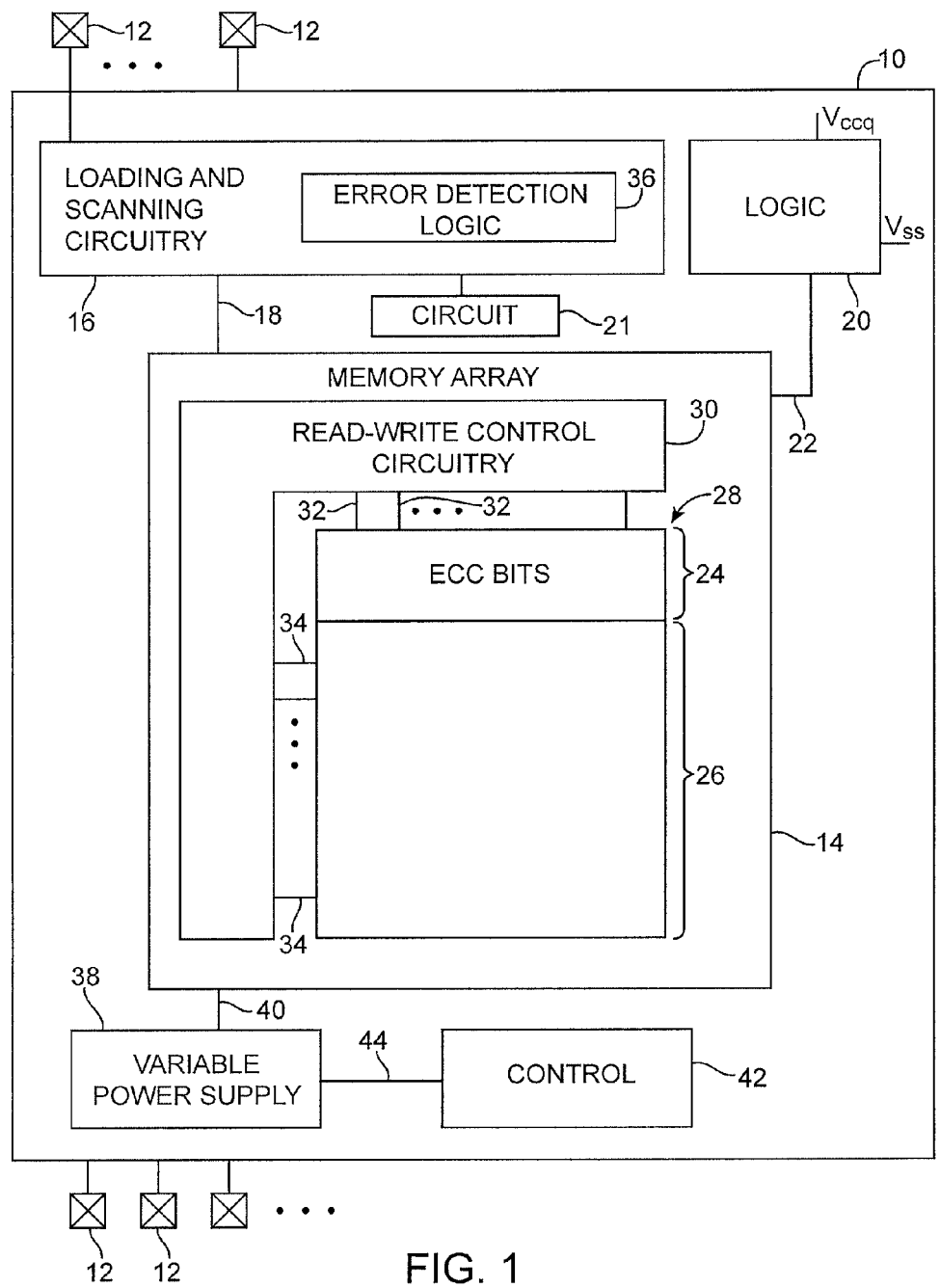
FIG. 1 is a diagram of an illustrative integrated circuit with memory element circuitry in accordance with an embodiment of the present invention.

This relates to integrated circuits with memory elements. The memory elements, which are sometimes referred to as cells, may contain any suitable number of transistors. With one suitable arrangement, each cell may contain eight transistors. If desired, more than eight transistors may be used in each cell. For example, each cell may contain nine transistors, ten transistors, eleven transistors, twelve transistors, or more than twelve transistors. Cells with fewer than eight transistors may also be used (e.g., seven transistors, six or fewer transistors, etc.).

Schemes in which a positive power supply voltage for the memory elements is lowered during clearing to facilitate clear operations are described herein as examples. If desired, clear operations may be facilitated by adjusting other voltage levels that are associated with the memory elements (e.g., by making adjustments to one or more other positive or ground power supply signals, by overdriving or otherwise adjusting control signals such as address signals, clear signals, or other control signals, by adjusting transistor body bias signals for the memory element transistors, and/or by making adjustments to the voltage levels associated with data signals for the memory elements). The schemes described herein in which positive power supply voltage levels are adjusted during clear operations are merely examples.

The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits (e.g., field-programmable gate arrays) in which memory elements are used for configuration memory, or any other suitable integrated circuit. For clarity, the memory elements will sometimes be described in the context of programmable integrated circuits. This is, however, merely illustrative and not intended to limit the scope of the present invention.

On integrated circuits such as memory chips or other circuits in which memory is needed to store processing data, the memory elements perform the functions of static random-access memory (RAM) cells and are sometimes referred to as SRAM cells. In the context of programmable circuits such as programmable logic device integrated circuits, the memory elements can be used to store configuration data and are therefore sometimes referred to in this context as configuration random-access memory (CRAM) cells. CRAM cells generally have outputs that are coupled by conductive paths to the gates of corresponding programmable logic transistors (sometimes referred to as pass gates or pass transistors). A CRAM cell that is loaded with a logic one will produce a high static signal at its output. A CRAM cell that is loaded with a logic zero will produce a low static output signal. These static control signals turn on and off associated programmable logic transistors to configure the transistors to implement a desired custom logic function.

An illustrative integrated circuit with memory elements is shown in FIG. 1. Integrated circuit device 10 may have input-output pins 12. Pins 12 may be used to receive power supply signals from external sources (e.g., from power supply lines on a system board). Pins 12 may also include data pins that are used in handing input and output data signals. Device 10 may include circuitry such as logic 20. Logic 20 may include hardwired logic and/or programmable logic (e.g., programmable pass transistors that form parts of programmable interconnects, programmable multiplexers, programmable look-up tables, programmable power-down transistors, etc.). Programmable logic in logic circuitry 20 may be configured to perform a custom logic function in accordance with configuration data loaded into memory elements in device 10. Circuitry such as circuit 21 (e.g., registers, a memory array, or other circuitry) may, if desired, be used in providing data for loading into memory elements in device 10.

Memory elements in device 10 may be provided in the form of an array such as memory array 14. Memory array 14 may contain read-write control circuitry 30 and an array of associated memory elements 28.

Array 28 may contain any suitable number of memory elements. For example, memory element array 28 may contain hundreds, thousands, or tens of thousands of rows and hundreds, thousands, or tens of thousands of columns of memory elements. If desired, memory array 28 may contain error correction code memory elements 24 and regular memory elements 26. Memory elements 26 may be used as a CRAM array that stores configuration data for programming pass gates in programmable logic within logic 20 (e.g., by providing static control signals from the outputs of memory elements 26 to corresponding pass gates in logic 20 using conductive lines in path 22). Memory elements 26 may also be used to store data for an on-chip or external processor (e.g., array 26 may be operable as an SRAM array without static control signal outputs). Error correction code memory elements 24 may form an array of memory elements that store error correction code information such as cyclic redundancy check (CRC) bits, parity bits, or other error correction codes corresponding to the data stored in elements 26. For example, each column of error correction code memory elements 24 may contain error correction code information corresponding to a respective column of memory elements 26.

The error correction code information that is stored in memory elements 24 may be used in determining whether errors are present in memory elements 26. Loading and scanning circuitry 16 may be used in data loading operations and in error monitoring and correction operations. During data loading operations, data that is received from an internal or external source (e.g., one of pins 12 or circuit 21) may be loaded into memory array 14 via path 18. Read-write control circuitry 30 may use lines such as lines 32 and 34 in reading and writing data for array 28. Lines 32 and 34 may include data lines (sometimes referred to as bit lines), control lines such as address lines (sometimes referred to as access control lines or word lines) and clear lines, and power supply lines (e.g., for positive and ground power supply voltages). During write operations, data from circuitry 16 may be loaded into array 28. During reading operations, data that is being stored in array 28 may be retrieved.

Loading and scanning circuitry 16 may include error detection logic 36. During operation of memory array 28, read-write control circuitry 30 and loading and scanning circuitry 16 may retrieve data from elements 26 and corresponding error correction code data from elements 24. The error correction code data may contain redundant information (e.g., CRC bits) corresponding to the data in elements 26. Error detection logic 36 may process the data retrieved from elements 26 and the ECC bits retrieved from elements 24 to determine whether errors are present in array 28 (e.g., due to radiation strikes). If an error is detected or if it is otherwise desired to reload data into a portion of array 28, a block of memory elements that contains the detected error can be cleared using read-write control circuitry 30. Following clearing operations, desired data may be loaded into the cleared group of memory elements using read-write control circuitry 30. One or more groups of memory elements in array 28 may also be cleared during power-up operations (i.e., when the positive power supply voltages that power device 10 are first ramped up).

Power supply voltages for array 14 may be generated by off-chip (external) power supply sources and/or on-chip supplies. For example, power supply voltages for array 14 may be supplied by variable power supply 38 via paths such as path 40. Variable power supply 38 may be controlled by power supply control circuitry such as circuitry 42 via path 44. For example, variable power supply 38 may be operable to supply different positive power supply voltage levels to the array 14 via path 40 and/or may be configured to operate in high-current-capacity and low-current-capacity states in response to control signals received via path 44. Using this type of arrangement, the magnitude of the power supply voltage (e.g., a positive power supply voltage Vcccram) that power supply 38 provides to array 14 may be lowered during clear operations to temporarily weaken memory elements 28 and thereby facilitate clear operations.

Figure 2:
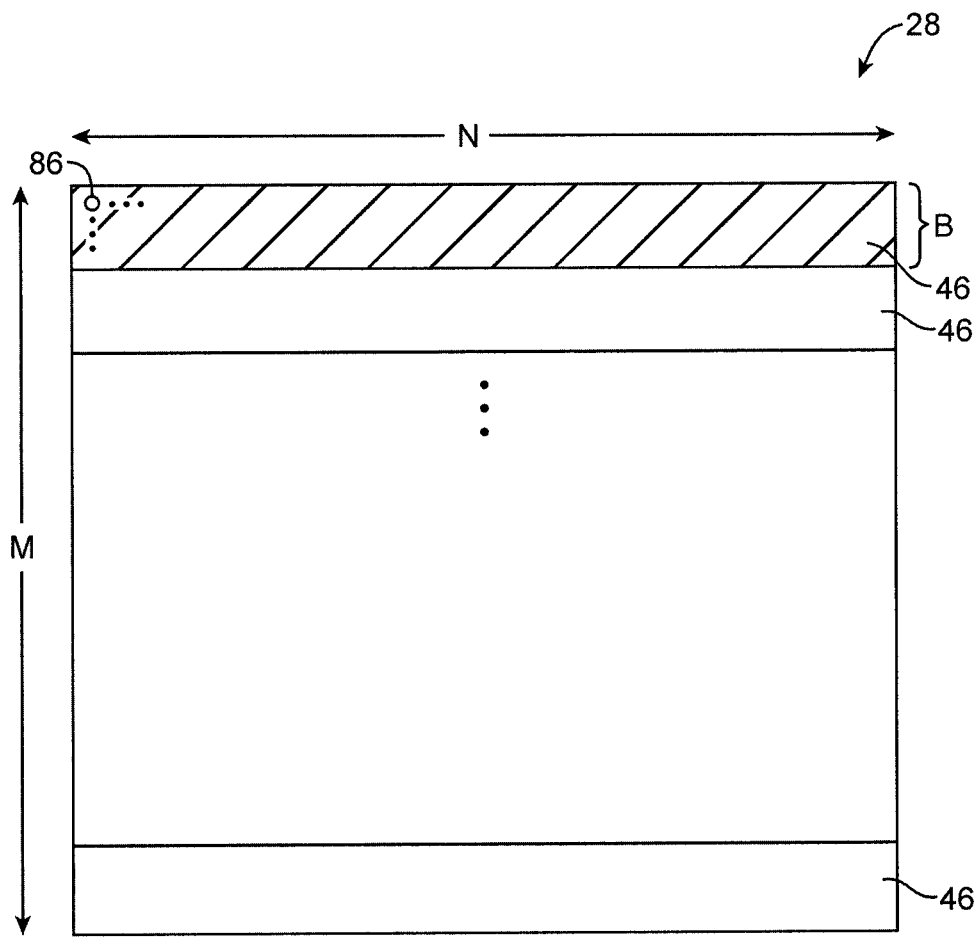
FIG. 2 is a diagram of an illustrative group of memory elements within an array of memory elements being cleared together in accordance with an embodiment of the present invention.

As shown in FIG. 2, memory array 28 may have memory elements 86 that are arranged in M rows and N columns (as an example). Blocks (groups) 46 of memory elements 86 such as group B may be cleared independently (e.g., one at a time to reduce current spikes that might arise when clearing large numbers of memory elements 86 simultaneously and/or to support selective reconfiguration operations. The values of M and N may be, for example, 1000 to 10,000 each (as an example) and B may be, for example, a 100×N block (as an example). If desired, memory elements 86 may be used in arrays where all elements 86 are cleared at the same time or in arrays in which multiple blocks of elements are cleared simultaneously. The example of FIG. 2 is merely illustrative.

Figure 3:
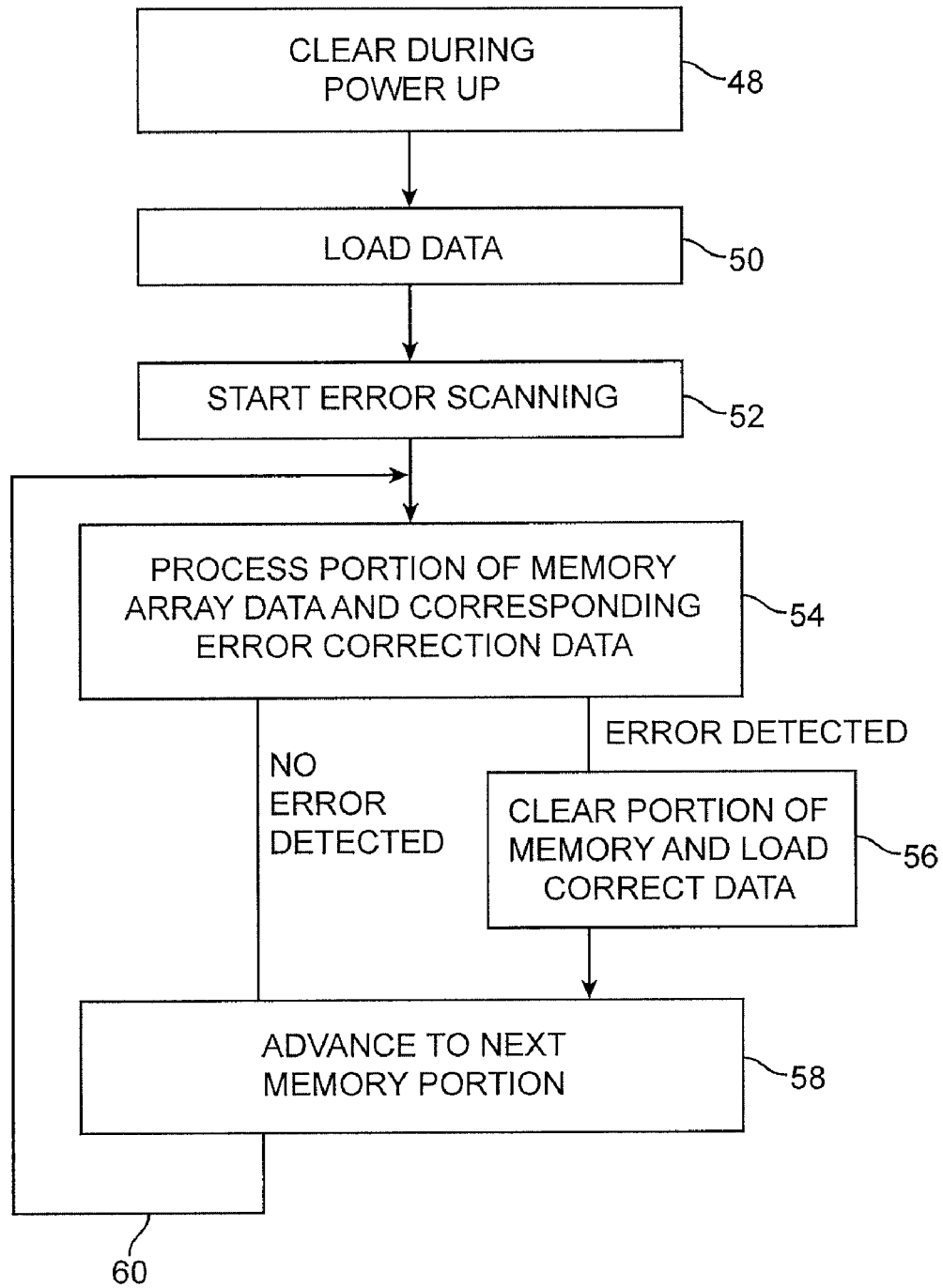
FIG. 3 is a flow chart of illustrative steps involved in clearing memory elements in an integrated circuit of the type shown in FIG. 1 in accordance with an embodiment of the present invention.

Illustrative steps involved in operating device 10 of FIG. 1 are shown in FIG. 3. At step 48, device 10 may be powered up. For example, power may be supplied to device 10 from a system board or other external power supply source. The power that is supplied may be supplied using one or more ground voltages (e.g., a Vss voltage of 0 volts, etc.), one or more positive power supply voltages (e.g., a quiet power supply voltage Vcc and a somewhat elevated power supply voltage of Vccr), etc. As power is supplied to device 10, memory element array 28 is cleared. This ensures that memory elements 86 in array 28 are placed in a known state that allows subsequent data loading operations to be performed reliably.

At step 50, data may be loaded into memory array 28 using loading and scanning circuitry 16 and read-write control circuitry 30.

Loading and scanning circuitry 16 may begin periodically checking the contents of array 28 for errors at step 52. With one suitable arrangement, ECC bits 24 may be located in the upper rows of array 28, each column of array 28 may contain some ECC bits and some normal data bits from the rows in region 26, and circuitry 16 may, during checking operations, continually retrieve columns of memory element data including data from normal elements 26 and corresponding ECC data from ECC bits 24 and may process this retrieved data to determine whether errors are present (step 54). If no errors are detected in a retrieved column of data (or other suitable portion of array 28), processing may advance to the next column of array 28, as indicated by step 58. Processing may then loop back to the operations of step 54, as indicated by line 60. If, however, an error is detected during the operations of step 54, read-write control circuitry 30 may clear a portion of the memory that contains the error (e.g., portion B of FIG. 2) and may load corrected data into the cleared portion (step 56).

Figure 4:
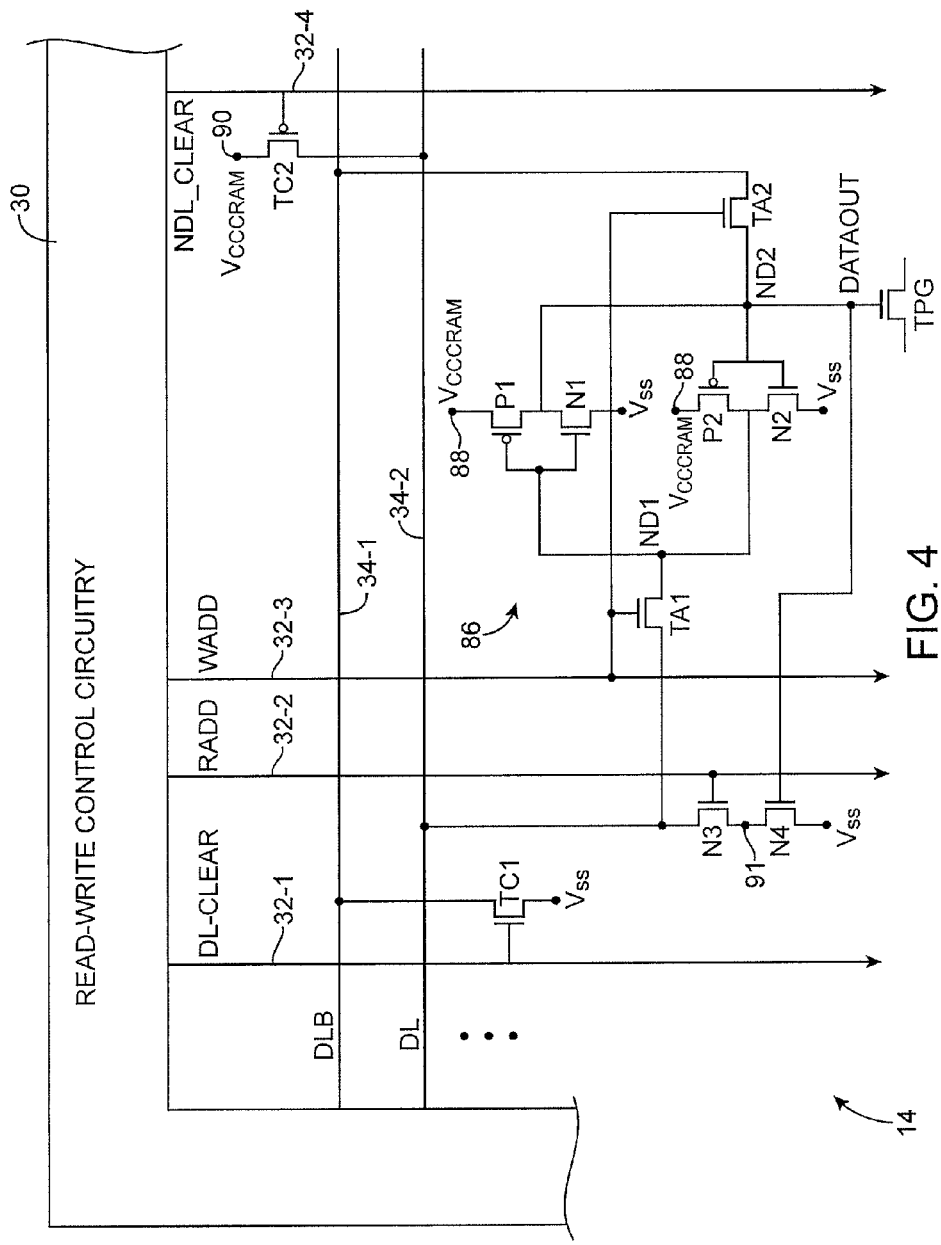
FIG. 4 is a circuit diagram of memory element circuitry in accordance with an embodiment of the present invention.

Illustrative memory element circuitry that may be used for memory elements such as memory element 86 of FIG. 2 and other circuitry in array 14 is shown in FIG. 4. In general, memory elements 86 may store data using any suitable type of bi-stable storage element. In the example of FIG. 4, memory element 86 has two cross-coupled inverters that form a bi-stable data storage element that stores data on data storage nodes ND1 and ND2. A first inverter is formed from p-channel metal-oxide-semiconductor (PMOS) transistor P1 and re-channel metal-oxide-semiconductor transistor N1. This first inverter has its input connected to node ND1 and has its output connected to node ND2. The second inverter in memory element 86 has its input connected to node ND2 and its output connected to node ND1. This second inverter is formed from PMOS transistor P2 and NMOS transistor N2. The first and second inverters are both connected in series between a positive power supply terminal that receives positive memory element power supply voltage Vcccram and a ground power supply terminal that receives ground power supply voltage Vss. The memory element power supply voltage Vcccram may be independently controlled from the positive power supply voltage Vccq that is used for powering logic gates and other circuits in logic 20 of FIG. 1.

Address transistors (sometimes referred to as access transistors) TA1 and TA2 may be used when reading and writing data for memory element 86. In the arrangement shown in FIG. 4, address transistor TA1 is an NMOS transistor that has a gate that is controlled by write address signal WADD on line 32-3 and address transistor TA2 is an NMOS transistor that has a gate that is controlled by write address signal WADD. The transistors of FIG. 4 such as transistors TA1 and TA2 each have a gate, a body (not shown), a source, and a drain. Source and drain terminals are sometimes collectively referred to herein as source-drain terminals. As shown in FIG. 4, transistor TA2 has its source-drain terminals connected respectively to data line DLB and node ND2, whereas transistor TA1 has its source-drain terminals connected respectively to data line DL and node ND1.

During operations such as write and clear operations, data lines DL and DLB may carry signals that are complements of one another. For example, read-write control circuitry 30 may drive a logic one onto line DLB when driving a logic zero onto line DL and vice versa. The arrangement of FIG. 4 is sometimes referred to as having a differential writing configuration, because during write operations transistor TA1 drives signals from line DL onto node ND1 while transistor TA2 simultaneously drives complementary signals from line DLB onto node ND2 (which stores data that is inverted with respect to node ND1). Once loaded, output data (called DATAOUT in FIG. 4) may be applied to the gate of an optional programmable pass gate such as optional pass transistor TPG (e.g., a pass gate in programmable circuitry in logic 20 of FIG. 1). In SRAM arrays, pass transistors TPG may be omitted.

Memory cell 86 may have a read circuit such as a read circuit made up of transistors N3 and N4. Transistor N3, which may sometimes be referred to as a read access transistor or address transistor, may have its gate connected to read address line 32-2 and may be responsive to read address signal RADD. Transistor N4 may have its gate coupled to data node ND2. Transistor N4 and transistor N3 form a buffer that helps ensure that read operations do not disturb the contents of memory element 86. When it is desired to read the contents of memory element 86 (i.e., the logic signal value on node ND2), signal RADD may be asserted by read-write control circuitry 30 (e.g., RADD may be taken high). This turns on transistor N3 and couples line DL to node 91. Transistor N4 has its gate coupled to ND2. When ND2 is high, N4 is on and pulls node 91 to Vss. When N3 is turned on in this situation, DL will be pulled low. When ND2 is low, N4 is off and DL will not be pulled low upon activation of transistor N3. Read-write control circuitry 30 can therefore sense the state of node ND2 by sensing the state of signal DL on line 34-2. Because read operations may be performed using only a single data line (i.e., line DL), the arrangement of FIG. 4 is sometimes referred to as having a single-ended read configuration.

Memory array 14 may have clear transistors such as clear transistors TC1 and TC2. To help reduce the amount of circuitry that is required within array 14 and therefore reduce circuit real estate and leakage currents, it may be desirable to minimize the number of clear transistors that are used in array 14. With one suitable arrangement, which is sometimes described herein as an example, transistors TC1 and TC2 are sparsely interspersed among the memory elements of the array, so that there are fewer clear transistors TC1 and TC2 in array 14 than there are memory elements 86. For example, each set of K memory elements 86 may be associated with a pair of clear transistors TC1 and TC2, where the value of K is about 100, is 10-100, is more than 10, is more than 50, is more than 100, is 10-1000, is 50-300, or has other suitable values. If, for example, K is 100, clear transistors TC1 and TC2 will serve as the exclusive clear transistors for a set of 100 associated memory elements.

Transistor TC1 may have one source-drain terminal connected to data line DLB and another source-drain terminal connected to a ground terminal at ground voltage Vss. The gate of transistor TC1 may be controlled by clear control signal DL_CLEAR on line 32-1. Transistor TC2 may have one source-drain terminal connected to data line DL and another source-drain terminal connected to terminal 90, which supplies positive power supply voltage Vcccram. Transistor TC1 may sometimes be referred to as a pull-down transistor, because TC1 can pull data line DLB down to ground voltage Vss when signal DL_CLEAR is asserted (i.e., when DL_CLEAR is taken high). Transistor TC2 may sometimes be referred to as a pull-up transistor, because TC2 can pull data line DL up to positive voltage Vcccram when signal NDL_CLEAR is asserted (i.e., when NDL_CLEAR is taken low).

During a typical clear operation, signals DL_CLEAR and NDL_CLEAR are simultaneously asserted, signal WADD is asserted, and the output drivers in circuitry 30 that drive lines DL and DLB are left floating. Assertion of write address signal WADD turns on transistors TA1 and TA2. This couples node ND1 to line DL and couples node ND2 to line DLB. The assertion of DL_CLEAR turns on transistor TC1. This pulls DLB low and therefore pulls ND2 low. The simultaneous assertion of NDL_CLEAR turns on transistor TC2 and pulls DL high. This pulls node ND1 high through transistor TA1. With ND1 pulled high and ND2 pulled low, memory element 86 is cleared (i.e., a "0" is stored on node ND2). Because there may be multiple memory elements 86 for each pair of clear transistors TC1 and TC2, the arrangement of FIG. 4 may be used to clear multiple memory elements 86 simultaneously. For example, the arrangement of FIG. 4 may be used to clear all memory elements 86 in a group of memory elements 86 such as block B of FIG. 2.

Figure 5:
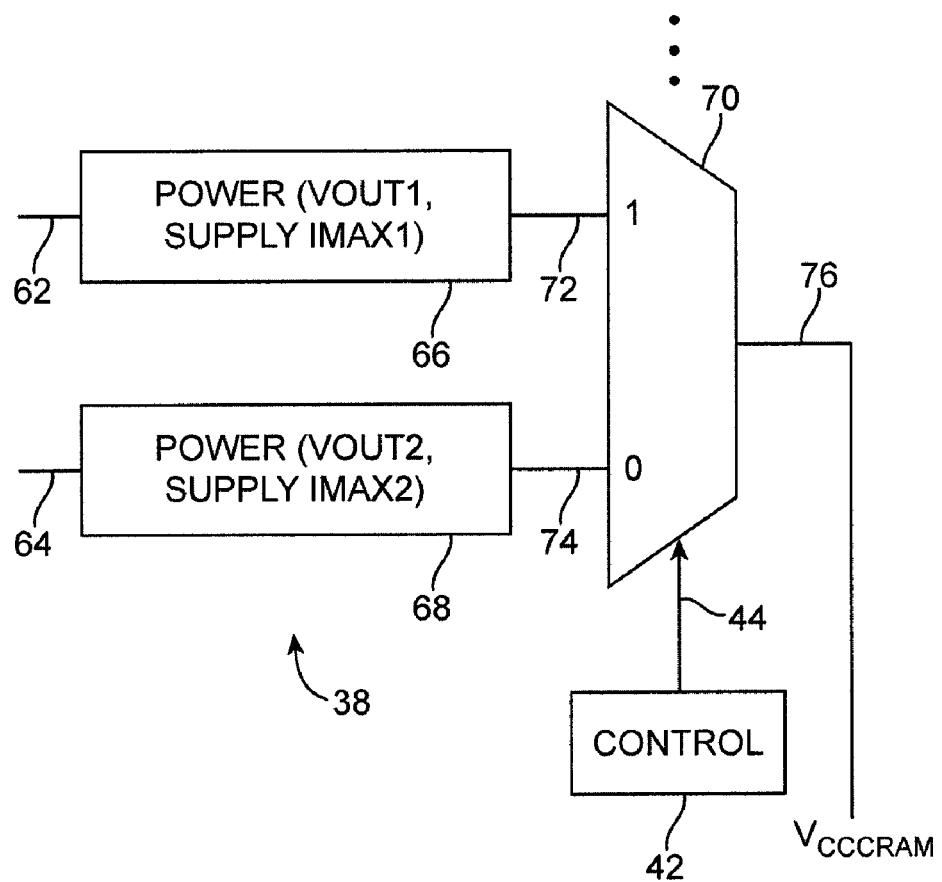
FIG. 5 is a diagram of illustrative adjustable power supply circuitry that may be used in controlling the power supply voltages that are provided to memory element circuits in accordance with an embodiment of the present invention.

To facilitate clearing operations, the power supply voltage Vcccram for memory elements 86 may be adjusted during clear operations. For example, adjustable power supply circuitry such as circuitry 38 of FIG. 5 may be used to supply power supply voltage Vcccram at a level that is lower during clearing operations than during normal operation. As shown in FIG. 5, power supply circuitry 38 may have a first power supply such as power supply 66 that receives power from a first respective input (input 62) and a second power supply such as power supply 68 that receives power from a second respective input (input 64). Inputs 62 and 64 may, if desired, be connected to separate voltage supplies or may be tied to a common source of power. For example, inputs 62 and 64 may be connected to a shared Vcc terminal that receives a positive power supply voltage Vcc of about 1.0 volts from one of pins 12 or input 62 may receive a 1.0 volt signal and input 64 may receive a 0.85 volt signal (as examples). Power supply 66 may produce a first power supply voltage Vout1 on output 72. Power supply 68 may produce a second power supply voltage Vout2 on output 74. The values of Vout1 and Vout2 may be different. For example, Vout2 may be less than Vout1 and may be used in powering memory elements 86 when clearing memory elements 86 during power-up or during normal operation.

Multiplexer 70 may receive voltages Vout1 and Vout2 on respective inputs 72 and 74 and may route a selected one of these power supply signals to output 76 in response to control signals received on path 44 from power supply control circuit 42. Output 76 may be used to provide power supply signal Vcccram to circuitry of the type shown in FIG. 4. Power supply control circuit 42 may produce one control signal (e.g., a logic "1") during normal operation of memory array 14 (i.e., when not clearing elements 86) and may produce another control signal (e.g., a logic "0") during clear operations (i.e., when clearing during power-up or when momentarily weakening memory elements 86 during clear operations after device 10 is been powered up and is operating normally).

The power supply arrangement of FIG. 5 is merely illustrative. If desired, the transistors of multiplexer 70 may be integrated into the output stages of supplies 66 and 68. For example, supplies 66 and 68 may each have output PMOS transistors that are controlled by control signals form control circuitry 42 and that are respectively coupled between one of inputs 62 and 64 and a shared output (line 76). These PMOS transistors can be selectively activated to switch either supply 66 or supply 68 into use.

Regardless of the circuit design used in implementing circuitry 38 of FIG. 5, circuitry 38 may provide Vout1 to terminal 76 for use as power supply voltage Vcccram during normal operation of memory elements 86 and may provide Vout2 to terminal 76 for use as power supply voltage Vcccram during clear operations. Because Vout2 is less than Vout1, use of Vout2 to power the memory element circuitry will weaken the first and second inverters of FIG. 4 (which receive power supply voltage Vcccram at terminals 88) during clear operations relative to their strength during normal operation. The reduced value of Vcccram is also preferably applied to power supply terminal 90 of transistor TC2 to avoid undesired current flow through transistor TC2, TA1 and P2 (which might arise if the voltage on terminal 90 were higher than the voltage on terminal 88 at the source-drain of P2).

Figure 6:
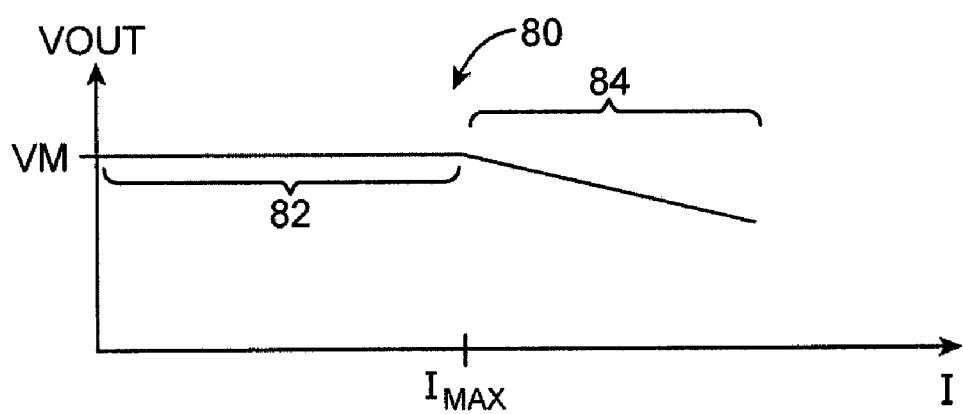
FIG. 6 is a graph showing the power supply voltage that is supplied by a power supply circuit of the type shown in FIG. 5 varying as a function of supply current in accordance with an embodiment of the present invention.

If desired, power supply 66 and power supply 68 may have different current capacities. For example, power supply 66 may be capable of supplying voltage Vout1 at a maximum current of 'max', whereas power supply 68 may be capable of supplying voltage Vout2 at a maximum current of Imax2. The graph of FIG. 6 illustrates how one or both of the power supplies (i.e., power supply 68) may behave when their maximum current capacity is exceeded. When the memory element circuitry (or other circuitry) that is being supplied with power supply voltage Vout (e.g., voltage Vcccram of FIG. 7) draws a current I with a magnitude of less than current Imax, the power supply may supply the voltage Vm at its nominal output voltage level. For example, supply 68 may supply voltage Vout2, provided that the amount of current drawn from supply 68 is less than Imax2 (see, e.g., flat portion 82 of output curve 80 in FIG. 6). When, however, the value of I exceeds Imax, the output of the power supply will tend to droop (see, e.g., portion 84 of curve 80 in FIG. 6). The ability of the power supply to supply a value Vm that is lower than normal and that weakens further as the current drawn from the power supply increases may be used to in providing weakened Vcccram signals to the memory element during clear operations.

Consider, as an example, a scenario in which power supply 66 and power supply 68 of adjustable power supply 38 of FIG. 5 are characterized by respective nominal output levels of 1.0 volts and 0.85 volts (i.e., Vout1 is 1.0 and Vout2 is 0.85) and in which Imax2 is exceeded during clear operations, while Imax1 is not exceeded during normal operations. During normal operation of device 10 (i.e., when array 14 is functioning as an SRAM array for storing data or in a memory chip or other integrated circuit or is functioning as a CRAM array for storing configuration data in a programmable integrated circuit), adjustable supply 38 will supply a Vcccram value of Vout1 (e.g., 1.0 volts). This Vcccram voltage may be used for powering array 14. Because the amount of current that is drawn from supply 66 is less than Imax1, voltage Vcccram will not sag significantly below 1.0 volts (in this example). During clear operations, however, the value of I may, at least momentarily, rise above Imax2. Initially, at the beginning of the clear operations, Vcccram at the output of supply 38 will be equal to the nominal value of Vout2 (i.e., a value that is reduced relative to the normal value of Vout1 to weaken the memory elements). When the amount of current drawn from supply 38 rises above Imax2, the output of supply 68 and therefore supply 38 may drop more (e.g., to 0.65 volts), thereby further weakening the cross-coupled inverters of memory elements 86 and making it easier to take ND1 high and ND2 low. Once clearing is complete, the amount of current that is being drawn from supply 38 may drop below Imax2 and power supply voltage Vcccram may rise back to Vout2. Power supply 38 may then be adjusted to use supply 66 to supply Vout1 to the memory elements for normal operation.

Figure 7:
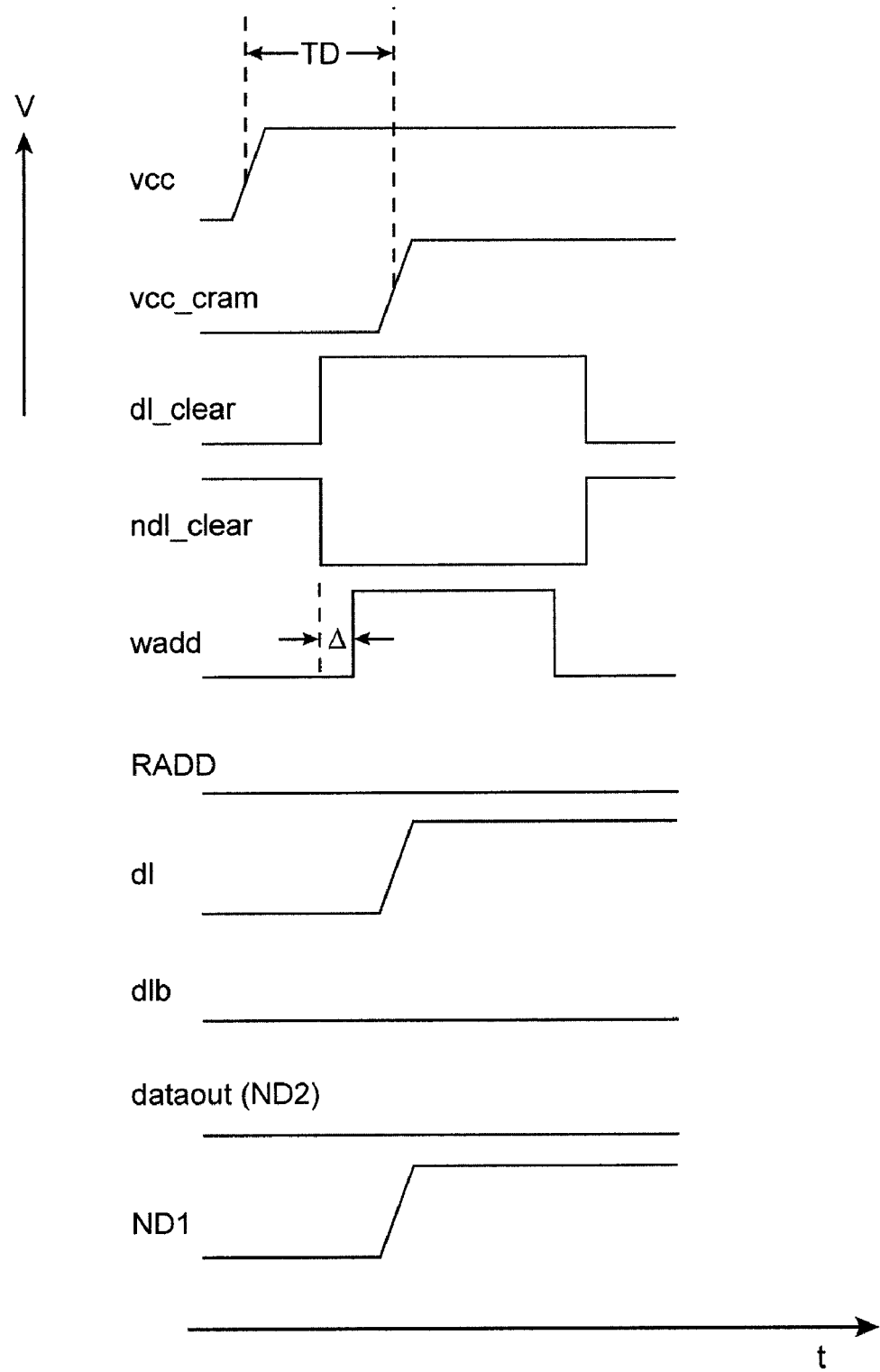
FIG. 7 shows signal traces for control and data signals that are used when performing power-up clear operations in an integrated circuit of the type shown in FIG. 1 in accordance with an embodiment of the present invention.

FIG. 7 shows illustrative signals involved in clearing array 14 of device 10 when performing clear operations during power-up (i.e., when ramping up power supply voltage Vcc at the inputs of power supply circuitry 38 of FIG. 5). As shown in FIG. 7, when power supply voltage Vcc is first applied to device 10 (e.g., from an external source), power supply voltage Vcc may ramp up from 0 volts to its maximum value (e.g., 1.0 volts or other suitable power supply voltage). Adjustable power supply circuitry 38 may create a delay TD in the time at which corresponding voltage Vcccram is applied at output 76. The delay TD between the time at which Vcc ramps up and the time at which Vcccram ramps up allows the control signals for memory array 14 to be preset to desired values before memory elements 86 are powered at terminals 88. In particular, delay TD allows clear signals DL_CLEAR and NDL_CLEAR and address signal WADD to be asserted before Vcccram is allowed to ramp up. (RADD is deasserted during clearing.) If desired, WADD may be delayed slightly (e.g., by delay time Δ) with respect to clear signals DL_CLEAR and NDL_CLEAR as shown in FIG. 7 to ensure that data line DL is low before turning on transistor TA2.

With the control signals (i.e., DL_CLEAR and NDL_CLEAR, WADD, and RADD) all preset to their desired levels, DL and ND1 successfully ramp up to Vcccram while DLB and ND2 remain at 0 in response to the ramping up of Vcccram after delay TD. Data storage node ND2 is held low through transistors TA2 and TC1 during the ramp up of Vcccram, because the high value of DL_CLEAR turns on TC1 and pulls DLB low while the high value of WADD turns on TA2 and couples ND2 to DLB. With node ND2 low, transistor N2 is off and transistor P2 is on, so signal DATAOUT remains low while node ND1 rises with the rise of Vcccram. Because NDL_CLEAR has been preset to a low value, transistor TC2 is on and pulls DL to Vcccram. When Vcccram ramps up, data line DL ramps up, helping to allow node ND1 to ramp up. The data line output drivers in read-write control circuitry 30 that are coupled to lines 34-1 (carrying data line signal DL) and 34-2 (carrying data line signal DLB) can float during the clear operation. Signal DLB remains low, because transistor TC1 is on (from the asserted DL_CLEAR signal) and is pulling DLB low.

During power-up clear operations, the value of Vcccram that is applied to the source-drain terminal (terminal 90) of transistor TC2 is preferably the same as the power supply voltage Vcccram that is applied to positive power supply terminal 88 of transistors P1 and P2. If Vcccram on transistor TC2 were higher than Vcccram on terminal 88, undesired current could flow between terminals 90 and 88 through a path made up of transistor TC2, TA1, and P2.

Figure 8:
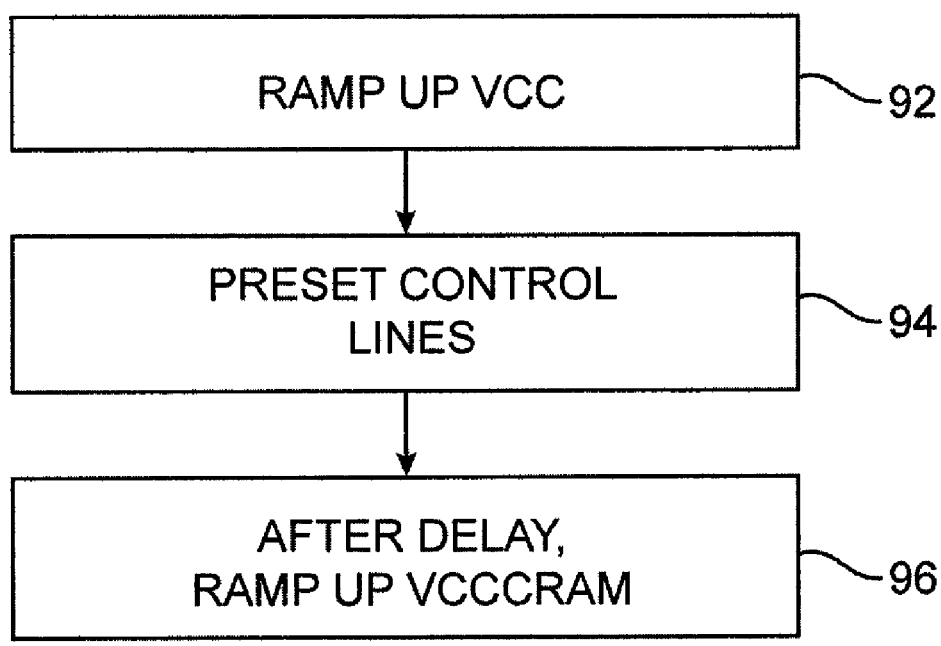
FIG. 8 is a flow chart of illustrative steps involved in clearing memory elements in an integrated circuit of the type shown in FIG. 1 during power up operations in accordance with an embodiment of the present invention.

Illustrative steps involved in clearing array 14 during power up operations are shown in FIG. 8.

At step 92, device 10 of FIG. 1 may be powered up. For example, an external voltage source on a system board or other voltage supply may apply voltage Vcc to the device 10. As Vcc is applied to device 10, power supply circuitry such as circuitry 38 may receive Vcc or other suitable power supply voltages at inputs such as inputs 62 and 64.

At step 94, read-write control circuitry 30 may preset the control lines for a desired block of memory elements 86 that are to be cleared. For example, read-write control circuitry 30 may assert DL_CLEAR by taking DL_CLEAR high, may assert NDL_CLEAR by taking NDL_CLEAR low, may assert WADD by taking WADD high (after a delay time Δ), and may deassert RADD by taking RADD low.

After presetting the control signals for memory array 14 to desired values, power supply voltage Vcccram may, at step 96, be ramped up to clear memory elements 86 using adjustable power supply circuitry 38 (i.e., using supply 66 to provide Vout2 to line 76).

Figure 9:
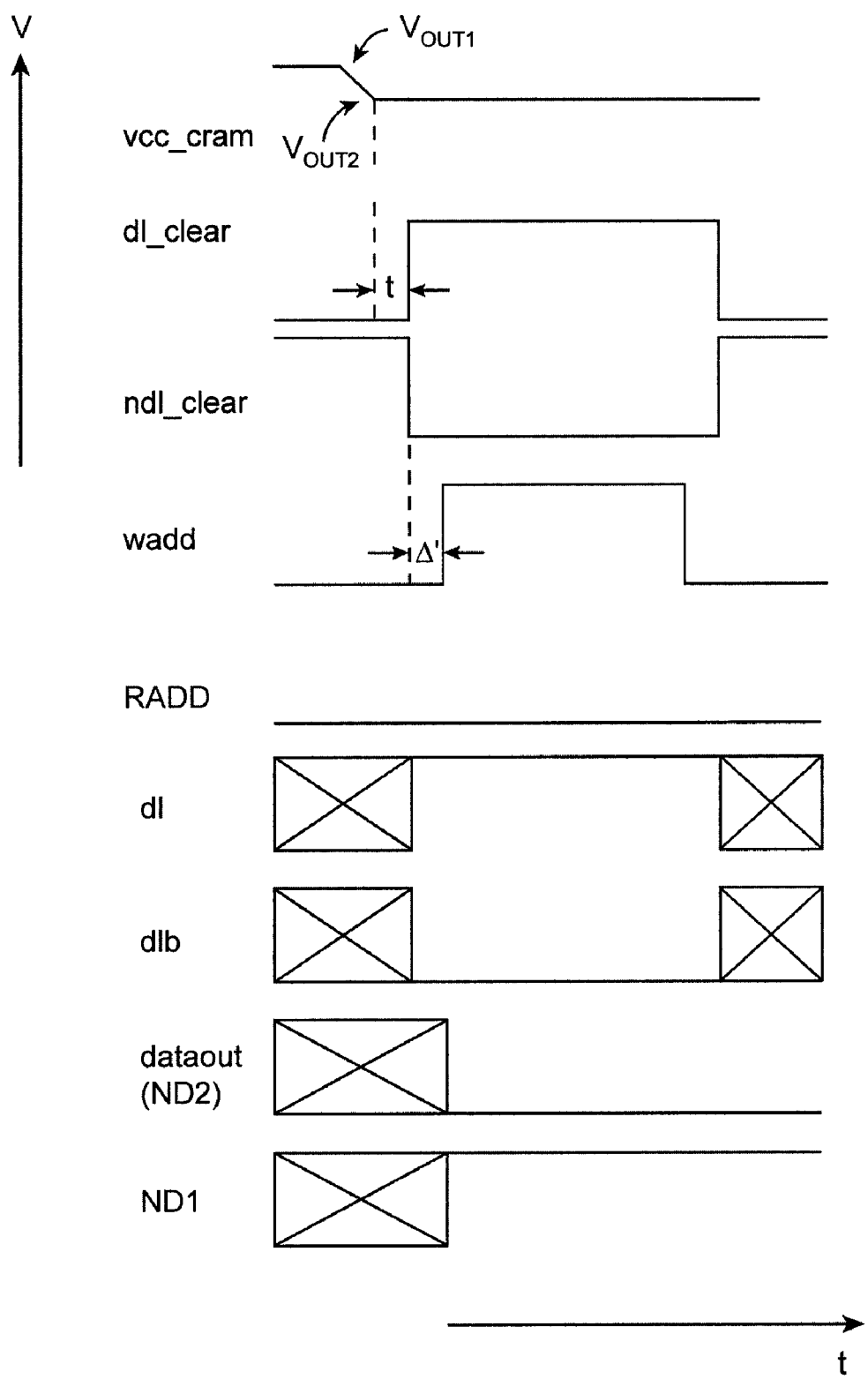
FIG. 9 shows signal traces for control and data signals that are used when performing clear operations in an integrated circuit of the type shown in FIG. 1 after the integrated circuit has been powered in accordance with an embodiment of the present invention.

FIG. 9 shows illustrative signals involved in clearing array 14 of device 10 when performing clear operations after power up.

Initially, during normal operation, circuitry 38 may be used to supply power supply voltage Vout1 to output 76, thereby powering memory elements 86 with a Vcccram level of Vout1. When it is desired to initiate clearing of memory elements 86, power supply voltage Vcccram may be lowered to Vout2, by switching multiplexer 70 or otherwise configuring power supply circuitry 38 (FIG. 5).

After Vcccram has been reduced to weaken elements 86 (i.e., after a delay τ), the clear control signals for the memory elements may be asserted to initiate clear operations. In particular, clear signals DL_CLEAR and NDL_CLEAR and address signal WADD may be asserted to clear memory elements 86. (RADD can be deasserted during clearing.) Write address signal WADD may be delayed slightly (e.g., by delay time Δ') with respect to clear signals DL_CLEAR and NDL_CLEAR to ensure that data line DL has been pulled high by transistor TC2 and that data line DLB has been pulled low by transistor TC1 before transistors TA1 and TA2 are turned on to drive the signals from DL and DLB onto nodes ND1 and ND2, respectively.

Figure 10:
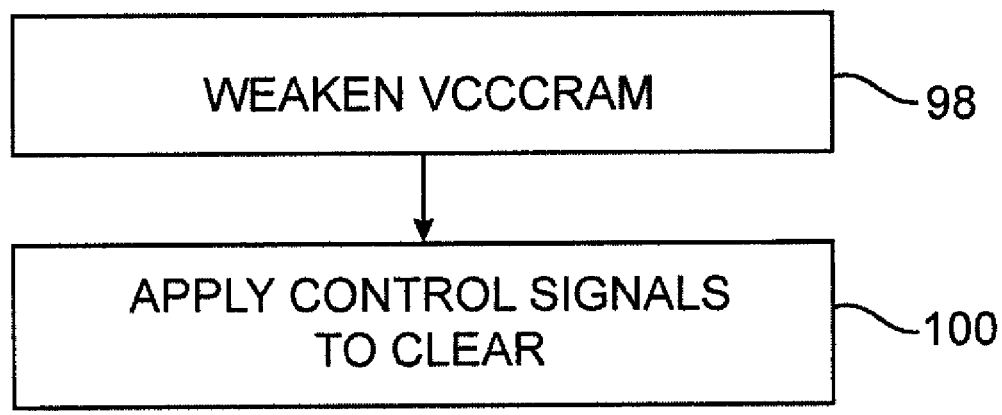
FIG. 10 is a flow chart of steps involved in clearing an array after power up operations using signals of the type shown in FIG. 9 in accordance with an embodiment of the present invention.
Figure 11:
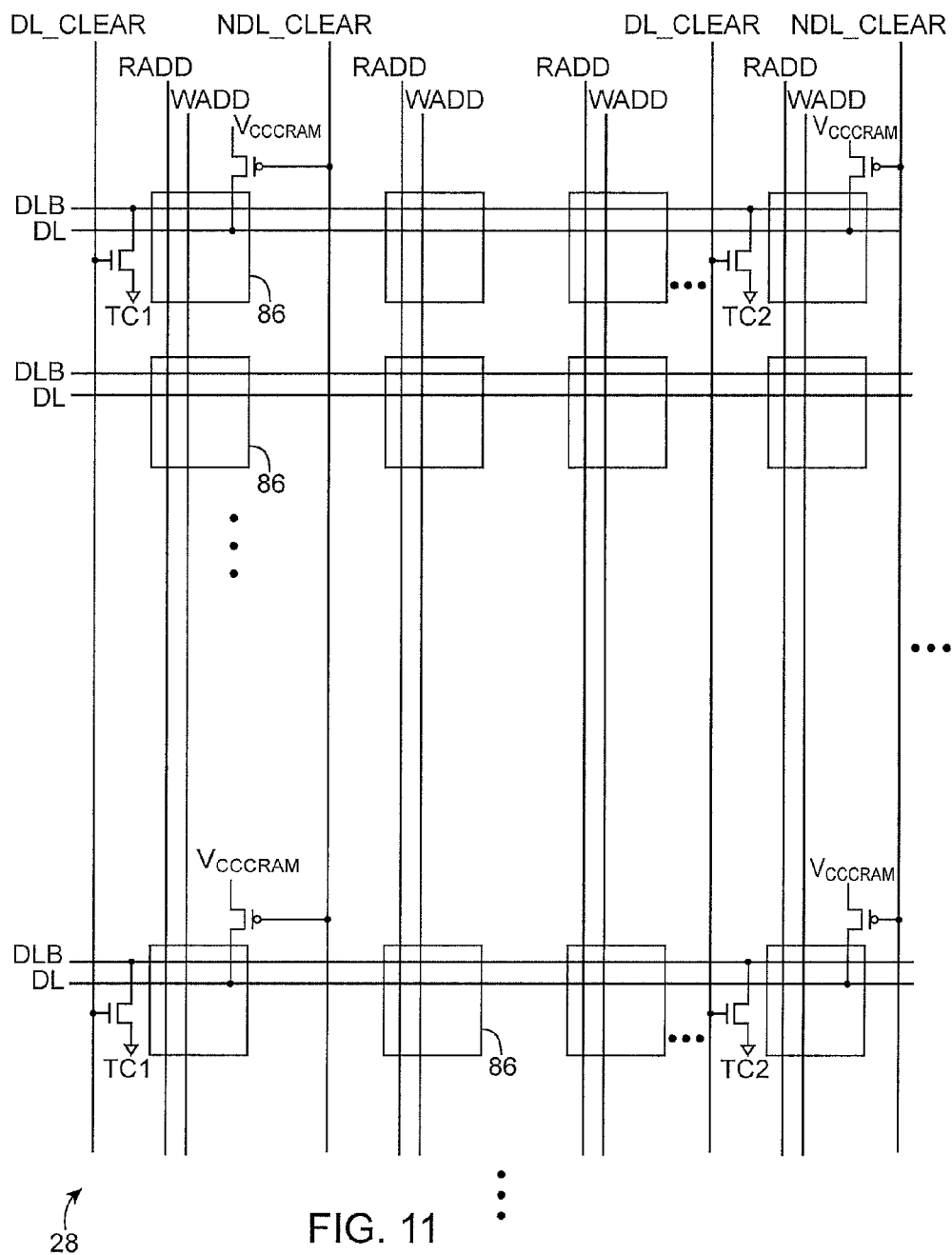
FIG. 11 is a circuit diagram showing clear transistors interspersed throughout an array of memory elements in an integrated circuit of the type shown in FIG. 1 in accordance with an embodiment of the present invention.

Illustrative steps involved in clearing array 14 after power up operations (i.e. in accordance with the traces of FIG. 9) are shown in FIG. 10.

At step 98, while device 10 of FIG. 1 is operating normally and is applying power supply voltage Vout1 as voltage Vcccram to memory elements 86, power supply 38 may be adjusted to take Vcccram from Vout1 to Vout2. After lowering Vcccram in this way, clear control signals may be applied at step 100 to memory elements 86 to clear the memory elements (i.e., clear signals DL_CLEAR and NDL_CLEAR and address signal WADD may be asserted). During clearing, the memory elements may draw more current I from power supply 38 than Imax2, causing Vout2 to drop further below Vout1 and thereby further weaken the bi-stable data storage element made up of the cross-coupled inverters in the memory elements.

For effective clearing, the sizes of the clear transistors may be chosen to be sufficiently large to overpower the output circuitry in power supply 38. Consider, as an example, a configuration for power supply 38 in which the output stage of power supply 38 (e.g., the output stage of power supply portion 68, which is used during clear operations) includes a PMOS power transistor Tpower as shown in circuit 12 of FIG. 12. Power supply voltage Vp (e.g., Vcc, Vout1, etc.) may be applied to one source-drain terminal of transistor Tpower and Vcccram may be produced at the outer source-drain terminal of Tpower. During operation of the power supply, the gate of Tpower may be taken low to activate the power supply and ramp up Vcccram.

Figure 12:
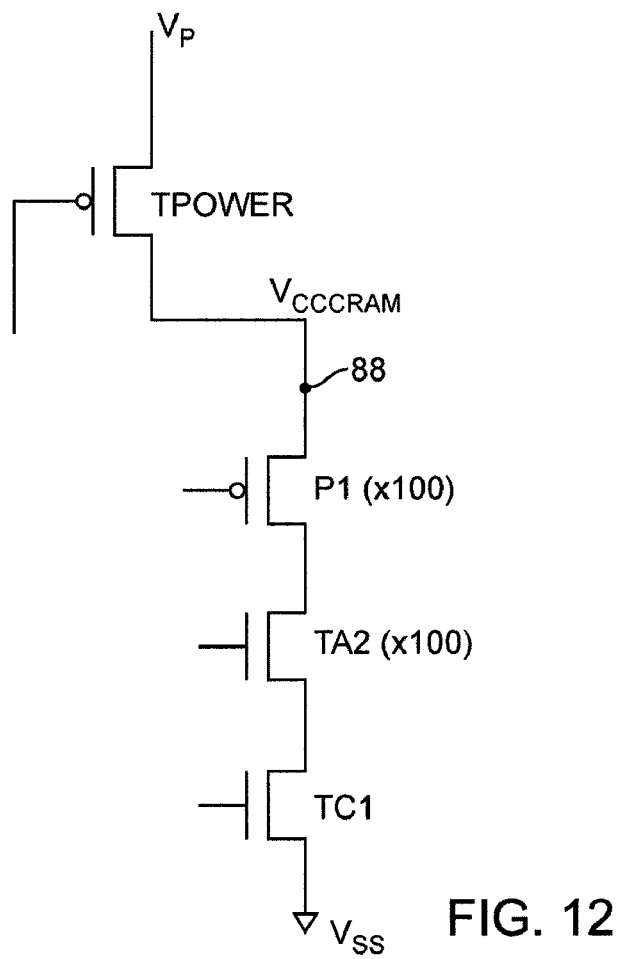
FIG. 12 is a circuit diagram showing transistors involved in clearing memory elements in an integrated circuit of the type shown in FIG. 1 in accordance with an embodiment of the present invention.

The circuit of FIG. 12 shows how Vcccram is applied in parallel to the terminal(s) 88 of 100 parallel P1 transistors. Each of these P1 transistors is connected in series with a respective transistor TA2 (see, e.g., FIG. 4). A common clear transistors TC1 is connected in series with these 100 transistors TA2. During clear operations, the pull-up strength of the 100 transistors P1 that are interposed between terminal 88 and ground Vss is effectively counterbalanced by pull-down strength of the 100 similarly-sized transistors TA2 that are interposed in this path. The effectiveness of the clear operation is therefore determined primarily by the relative strengths of pull-up transistor Tpower and pull-down transistor TC1. For effective clearing operations, TC1 should generally be stronger than Tpower.

Figure 13:
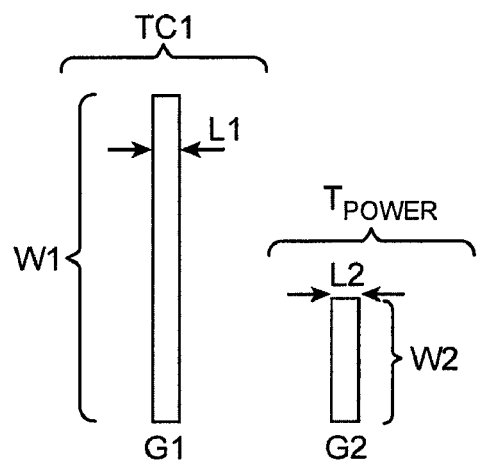
FIG. 13 is a diagram showing data line driver transistors and clear transistors sized in relation to one another to facilitate clear operations in accordance with an embodiment of the present invention.

An illustrative configuration is shown in FIG. 13. As shown in FIG. 13, transistor TC1 may be characterized by a gate G1 of length L1 and a width of W1, whereas transistor Tpower may be characterized by a gate G2 of length L2 and a width of W2. The lengths L1 and L2 of the transistors may, if desired, be set to the minimum allowed by the design rules of the semiconductor fabrication process that is used in fabricating device 10 (i.e., L1 and L2 may be equal). The widths W1 and W2 may be used to establish the strength of transistors TC1 and Tpower, respectively. Width W1 is preferably greater than W2 (e.g., W1 may be at least 1.5 times greater than W2, W1 may be at least two times greater than W2, W1 may be at least three times greater than W2, etc.). Transistor Tpower may be located in circuit 38 of FIG. 5 (e.g., as the output transistor in circuit 68).

In a typical device 10, there may be numerous blocks 46 of memory elements 86, as described in connection with FIG. 2. It may be desirable to clear each of these groups of memory elements 86 independently to avoid the large current spikes that otherwise might be associated with clearing all of array 14 simultaneously or to reconfigure part of the memory element array on device 10 without disturbing other portions of the memory element array or other device operations. To allow Vcccram to be weakened selectively in each desired group 46, each group 46 of memory elements 86 may be powered by Vcccram through a respective multiplexer 70 or other configurable power supply circuitry, as shown in FIG. 5. During normal operation, the control signal for all multiplexers 70 may be asserted (e.g., taken high) to ensure that all memory groups 46 are supplied with Vout1. When it is desired to clear transistors in a given group 46, the multiplexer 70 that is associated with that group may be supplied with a control signal (e.g., a low signal) that directs the multiplexer for that group to apply Vout2 to line 76 in that group. This selectively weakens the memory elements 86 in the given group 46 while allowing the other memory elements to operate normally.

During write operations, read-write control circuitry 30 may take signal DL_CLEAR low and may take signal NDL_CLEAR high to deactivate the clear transistors. Data lines DLB and DL may then be taken to appropriate values, depending on whether it is desired to write a "1" (DLD="1" and DL="0") or a "0" (DLB="0" and DL="1") into the memory element. After data lines DLB and DL have been driven to desired values, write address control signal WADD may be asserted to write data onto the data storage nodes of the memory element.

During read operations, read-write control circuitry 30 may also take signal DL_CLEAR low and may take signal NDL_CLEAR high to deactivate the clear transistors. The read address signal RADD may then be asserted to turn on transistor N3. Transistor N4 has its gate coupled to data storage node ND2, so data line DL will reflect the data stored in memory element 86 and can be monitored using read-write control circuitry 30. If desired, a differential reading scheme may be used for in which address transistors TA1 and TA2 are used to read out data onto lines DLB and DL in place of the read circuit made up of transistors N3 and N4.

The use of clear transistors TC1 and TC2 assists device 10 in performing satisfactory clear operations without the need to oversize the address transistors TA1 and TA2 in memory elements 86 and/or the data line drivers in read-write control circuitry 30. During clearing, a "0" is effectively "written" onto node ND2. During this operation, DLB is held at "0." This "0" on line DLB must overpower transistor P1 to pull ND2 low and a corresponding "1" on DL must overpower transistor N2 to pull ND1 high. It can be challenging to design data line drivers in read-write control circuitry 30 that are sufficiently strong to overpower hundreds or more of transistors P1 and N2 simultaneously (for block clears) without the assistance of clear transistors TC1 and TC2. For example, the data line drivers would need to overcome Ohmic losses in the data lines. When TC1 and TC2 are used as described in connection with FIG. 3, however, clearing operations can be performed effectively while minimizing the size and complexity of the circuitry used in clearing.

The foregoing is merely illustrative of the principles of this invention and various modifications can be made by those skilled in the art without departing from the scope and spirit of the invention.

What is claimed is:

1. A memory element circuit, comprising:
   a bi-stable data storage element operable to be powered at a power supply voltage;
   at least one clear transistor that is coupled to the bi-stable data storage element and that is operable to receive the power supply voltage; and
   adjustable power supply circuitry operable to lower the power supply voltage from a first level to a second level to clear the bi-stable data storage element using the clear transistor.

2. The memory element circuit defined in claim 1 wherein the bi-stable data storage element includes at least one inverter having a power supply terminal that is operable to receive the power supply voltage and at least one ground terminal.

3. The memory element circuit defined in claim 1 wherein the bi-stable data storage element comprises two cross-coupled inverters.

4. The memory element circuit defined in claim 1 further comprising a pair of address transistors coupled to the bi-stable data storage element.

5. The memory element circuit defined in claim 4 wherein the bi-stable data storage element comprises first and second data storage nodes, wherein the first data storage node is operable to store inverted data with respect to the second data storage node, and wherein one of the address transistors has a first terminal coupled to the first data storage node and has a second terminal that is coupled to a data line, and wherein the clear transistor has a first terminal operable to receive the power supply voltage and has a second terminal that is coupled to the data line.

6. The memory element circuit defined in claim 5 further comprising a read circuit that is coupled to the first data storage node.

7. The memory element circuit defined in claim 5 further comprising a programmable transistor having a gate that is coupled to the second data storage node.

8. The memory element circuit defined in claim 1, wherein the clear transistor is one of a pair of clear transistors used in clearing the bi-stable data storage element.

9. The memory element circuit defined in claim 8 further comprising a pair of address transistors coupled to the bi-stable data storage element, wherein a first of the pair of address transistors has a terminal coupled to a first data line, wherein a first of the pair of clear transistors has a terminal coupled to the first data line, wherein a second of the pair of address transistors has a terminal coupled to a second data line, and wherein a second of the pair of clear transistors has a terminal coupled to the second data line.

10. The memory element circuit defined in claim 1 wherein the bi-stable data storage element comprises a first inverter having an input coupled to a first data storage node associated with the bi-stable data storage element and an output coupled to a second data storage node associated with the bi-stable data storage element, wherein the bi-stable data storage element further comprises a second inverter having an input coupled to the second data storage node and an output coupled to the first data storage node, and wherein the memory element circuit further comprises a first address transistor coupled between a first data line and the first data storage node, and a second address transistor coupled between a second data line and the second data storage node.

11. The memory element circuit defined in claim 10 wherein the at least one clear transistor comprises first and second clear transistors, wherein the first clear transistor is coupled between the first data line and a terminal at the power supply voltage, and wherein the second clear transistor is coupled between the second data line and a terminal at a ground power supply voltage.

12. The memory element circuit defined in claim 1 further comprising at least one address transistor that is coupled between the bi-stable data storage element and a data line, wherein the at least one clear transistor has a first source-drain terminal coupled to the data line and has a second source-drain terminal coupled to a power supply terminal at the power supply voltage.

13. A memory element circuit, comprising:
a bi-stable data storage element having a data storage node operable to store data;
an address transistor operable to address the bi-stable data storage element and being coupled between a data line and the data storage node; and
a clear transistor operable to clear the data storage node and being coupled between the data line and an adjustable power supply voltage.

14. The memory element circuit defined in claim 13 wherein the bi-stable data storage element comprises a first inverter having an input coupled to the data storage node, wherein the data storage node comprises a first data storage node, wherein the bi-stable data storage element comprises an output coupled to a second data storage node, wherein the bi-stable data storage element comprises a second inverter having an input coupled to the second data storage node and having an output coupled to the first data storage node, wherein the address transistor comprises a first address transistor associated with the bi-stable data storage element, wherein the data line comprises a first data line associated with the bi-stable data storage element, wherein the memory element circuit comprises a second data line associated with the bi-stable data storage element, and wherein the memory element circuit further comprises:
a second address transistor associated with the bi-stable data storage element, wherein the second address transistor is coupled between the second data line and the second data storage node.

15. The memory element circuit defined in claim 14 wherein the clear transistor comprises a first clear transistor, the memory element circuit further comprising a second clear transistor that is coupled between the second data line and a ground terminal.

16. The memory element circuit defined in claim 15 wherein the first and second inverters are each operable to receive the adjustable power supply voltage and a ground voltage.

17. The memory element circuit defined in claim 16 further comprising adjustable power supply circuitry operable to lower the adjustable power supply voltage from a first level to a second level during clearing of the bi-stable data storage element using the first clear transistor and the second clear transistor.

18. The memory element circuit defined in claim 17 wherein the adjustable power supply circuitry has an output transistor that is operable to supply the adjustable power supply voltage to the first and second inverters and to the first clear transistor, wherein the output transistor has a first gate width, and wherein the second clear transistor has a second gate width that is greater than the first gate width.

19. Memory element circuitry, comprising:
read-write circuitry operable to load data;
a plurality of memory elements that are operable to be cleared by the read-write circuitry using clear control lines and data lines; and
at least one clear transistor that is coupled to the plurality of memory elements through one of the data lines that is operable to clear the plurality of memory elements in response to control signals from the read-write circuitry, and that is supplied with an adjustable power supply voltage.

20. The memory element circuitry defined in claim 19 wherein at least one of the memory elements includes at least one address transistor that is operable to receive address control signals from an address line and that is coupled between a data storage node in that one memory element and one of the data lines.

21. The memory element circuitry defined in claim 20 wherein the plurality of memory elements comprises one group of a plurality of groups of memory elements in a memory element array and wherein each of the groups of the memory elements is operable to be controlled by at least one respective pair of clear transistors.

22. A memory element array, comprising:
- a plurality of memory elements arranged in rows and columns, each memory element having a first inverter having an input coupled to a first data storage node and an output coupled to a second data storage node, a second inverter having an input coupled to the second data storage node and an output coupled to the first data storage node, a first address transistor coupled between a first data line and the first data storage node, a second address transistor coupled between a second data line and the second data storage node;
- a first clear circuit that is only coupled between the first data line and a terminal at a first power supply voltage; and
- a second clear circuit that is only coupled between the second data line and a terminal at a second power supply voltage that is different than the first power supply voltage, wherein the first and second inverters are each coupled between a terminal at the first power supply voltage and a terminal at the second power supply voltage.

23. The memory element array defined in claim 22, wherein the first clear circuit comprises a first clear transistor, wherein the second clear circuit comprises a second clear transistor, and wherein the first and second clear transistors serve as the exclusive clear transistors for the plurality of memory elements.

24. The memory element array defined in claim 22 further comprising adjustable power supply circuitry operable to maintain the first power supply voltage at a first voltage level during normal operation of the plurality of memory elements and at a second voltage level while clearing the plurality of memory elements, wherein the second voltage level is lower than the first voltage level.

* * * * *